United States Patent [19]

Furtek

[11] Patent Number: 5,155,389
[45] Date of Patent: * Oct. 13, 1992

[54] PROGRAMMABLE LOGIC CELL AND ARRAY

[75] Inventor: Frederick C. Furtek, Arlington, Mass.

[73] Assignees: Concurrent Logic, Inc., Sunnyvale; Apple Computer, Cupertino, both of Calif.

[*] Notice: The portion of the term of this patent subsequent to May 28, 2008 has been disclaimed.

[21] Appl. No.: 705,243

[22] Filed: May 24, 1991

Related U.S. Application Data

[60] Continuation of Ser. No. 427,160, Oct. 25, 1989, Pat. No. 5,019,736, which is a continuation-in-part of Ser. No. 378,106, Jul. 19, 1989, Pat. No. 5,089,973, which is a division of Ser. No. 928,527, Nov. 7, 1986, Pat. No. 4,918,440.

[51] Int. Cl.$^5$ ............................................. H03K 19/177
[52] U.S. Cl. .................................. 307/465; 307/243; 307/465.1
[58] Field of Search .............. 307/465, 465.1, 466–469, 307/243, 303.1, 303.2, 272.2; 340/825.83, 825.87, 825.91; 357/45

[56] References Cited

U.S. PATENT DOCUMENTS

| | | | |
|---|---|---|---|
| Re. 31,287 | 6/1985 | Patil | 340/825.79 |
| 3,400,379 | 9/1968 | Harman | 340/825.79 |
| 3,466,990 | 5/1969 | Goldenberg | 307/465 |
| 3,731,073 | 5/1973 | Moylan | 235/152 |
| 3,818,252 | 6/1974 | Chiba et al. | 307/303.1 |
| 3,818,452 | 6/1974 | Greer | 340/166 R |
| 3,912,914 | 10/1975 | Moylan | 235/152 |
| 4,034,356 | 12/1975 | Howley et al. | 340/173 R |
| 4,068,214 | 1/1978 | Patil | 340/166 R |
| 4,161,662 | 7/1979 | Malcolm et al. | 307/213 |
| 4,240,094 | 12/1980 | Mader | 357/45 |
| 4,293,283 | 10/1981 | Patil | 307/465 |
| 4,331,950 | 5/1982 | Barabas | 340/825.87 |
| 4,422,072 | 12/1983 | Caulan | 340/825.87 |
| 4,431,928 | 2/1984 | Skokan | 307/465 |
| 4,451,895 | 5/1984 | Sliwkowski | 364/521 |
| 4,467,439 | 8/1984 | Rhodes | 364/716 |
| 4,600,846 | 7/1986 | Burrows | 307/465 |
| 4,611,236 | 9/1986 | Sato | 357/45 |
| 4,642,487 | 2/1987 | Carter | 307/465 |
| 4,700,187 | 10/1987 | Furtek | 340/825.83 |

FOREIGN PATENT DOCUMENTS

EP0094234 11/1983 European Pat. Off. .
EP0204034 12/1986 European Pat. Off. .

OTHER PUBLICATIONS

Karatsu et al., "An Integrated Design Automation System for VLSI Circuits", *IEEE Design & Test of Computers*, vol. 2, No. 5, pp. 17–26, (Oct. 1985).

(List continued on next page.)

*Primary Examiner*—David Hudspeth
*Attorney, Agent, or Firm*—Pennie & Edmonds

[57] ABSTRACT

A logic cell is described having four inputs, four outputs, a control store, means for multiplexing the four inputs onto two leads and logic means that operate in response to the signals on the two leads and signals from the control store to produce output signals which are applied to the four outputs. Illustrative logic functions provided by the logic means include a cross-over or identify function, a change in the routing direction of an input signal, NAND and XOR gates and a D-type flip-flop. The selection of two of the four inputs as well as the selection of the particular logic function that is implemented is controlled by control bits stored in the control store. Numerous such logic cells are arranged in a two-dimensional matrix such that each cell has four nearest neighbor cells, one to its left (or to the West) one to its right (or to the East), one above it (or to the North) and one below it (or to the South). Each one of the four inputs to a logic cell comes from a different one of that cell's four nearest neighbors and similarly each one of a cell's outputs is provided to a different one of that cell's four nearest neighbors. As a result of this arrangement, individual cells can be combined to produce blocks of cells that implement all manner of functions.

23 Claims, 11 Drawing Sheets

OTHER PUBLICATIONS

Krug et al., "Abaenderbare Gatter-Anordningen", *Elektronik*, vol. 35, No. 22 pp. 170-171, 174-176, (Oct. 1986).

Manning, "An Approach to Highly Integrated, Computer-Maintained Cellular Arrays", *IEEE Transactions on Computers*, vol. C-26 No. 6, pp. 536-552, (Jun. 1977).

King, "Subcircuits on Linear Arrays-A New Array Topology", *IEEE Proceedings of the IEEE 1985 Custom Integrated Circuits* Conference, pp. 470-474, (May 1985).

Hartmann, "CMOS Erasable Programmable Logic Devices TTL Replacement Made Easy", *Electro and Mini-Micro Northeast Conference Record*, pp. 1-9, (Apr. 1985).

Collett, "Programmable Logic Soars Into New Dimensions", *Digital Design*, pp. 42-54 (Apr. 1985).

Wills, "Ultra-Fine Grain Processing Architectures", *M.I.T. VLSI Memo No.* 85-245, (May 1985).

Pacas-Skewes, "A Design Methodology for Digital Systems Using Petri Nets", Ph.D. dess, U. of Texas at Austin, (1979).

Kukreja et al., "Combinational and Sequential Cellular Structures", *IEEE Transactions on Computers*, vol. C-22, No. 9, pp. 813-823, (Sep. 1983).

"Storage/Logic Arrays Finally Get Practical", *Electronics*, pp. 29-33, (Jan. 1986).

Israelson et al., "Comparison of the Path Programmable Logic Design Methodology . . . ", *IEEE Int'l. Conference on Computer Design*, pp. 73-76, (Oct. 1985).

Barney, "Logic Designers Toss Out the Clock", *Electronics* pp. 42-45, (Dec. 1985).

Misunas, "Petri Nets and Speed Independent Designs", *Comm. of the ACM.* vol. 16, No. 8, pp. 474-481, (Aug. 1973).

Agerwala, "Putting Petri Nets to Work", *IEEE Computer*, pp. 85-94, (Dec. 1979).

Seitz, "Concurrent VLSI Architectures", *IEEE Trans. on Computers*, vol. C-33, No. 12, pp. 1247-1265, (Dec. 1984).

Snyder, "Parallel Programming and the Poker Programming Environment", *IEEE Computer*, pp. 27-33, (Jul. 1984).

Patil and Dennis, "The Description and Realization of Digital Systems", *M.I.T. Computer Str. Group Memo No.* 71 (Oct. 1972).

Patil, "Circuit Implementation of Petri Nets", *M.I.T. Computer Str. Group Memo No.* 73, (Dec. 1972).

Jump, "Asynchronous Control Arrays", *IEEE Trans. on Computers*, vol. C-23, No. 10 (Oct. 1974).

Patil, "Cellular Arrays for Asynchronous Control", *M.I.T. Computer Str. Group Memo No.* 122, (Apr. 1975).

Patil, "A Micro-Modular Implementation of the Control Modular of Basic Macro-Modular Circuits", *M.I.T. Computer Str. Group Memo* 43, (Oct. 1969).

Stucki, "Synthesis of Level Sequential Circuits", *Computer Systems Lab., Washington University*, (date not available).

Patil and Dennis, "Speed Independent Asynchronous Circuits", *M.I.T. Computer Str. Group Memo No.* 54, (Jan. 1971).

Patil and Welch, "A Programmable Logic Approach for VLSI", *IEEE Transactions of Computers*, vol. C-28, No. 9, pp. 594-601, (Sep. 1979).

Xilinx and Hamilton/Avnet, Present Logic Cell Arrays TM: "The User Programmable Gate Arrays", *Xilinx, Inc.*

Synder, "Introduction to the Configurable, Highly Parallel Computer", *IEEE Computer*, pp. 47-55, (Jan. 1982).

PROGRAMMABLE LOGIC CELL AND ARRAY

CROSS REFERENCE TO RELATED PATENT AND APPLICATION

This is a continuation of application Ser. No. 07/427,160, filed Oct. 25, 1989, now U.S. Pat. No. 5,019,736, which is a continuation-in-part of application No. Ser. No. 07/378,106 filed Jul. 11, 1989, now U.S. Pat. No. 5,089,973 which is a divisional application of application Ser. No. 06/928,527 filed Nov. 7, 1986 for "Programmable Logic Cell and Array" now U.S. Pat. No. 4,918,440 which is incorporated herein by reference. A related patent is U.S. Pat. No. 4,700,187 for "Programmable Asynchronous Logic Cell and Array" which is incorporated herein by reference.

FIELD OF THE INVENTION

This invention relates to the field of digital logic circuits and, more particularly, to programmable and reprogrammable logic devices.

BACKGROUND OF THE INVENTION

In the field of digital systems design, considerable efforts have been directed towards shortening -development cycles. One of the significant factors in the length of such product-development cycles is the time required for the design and fabrication of digital integrated circuits (IC's). Once a circuit design is completed, it generally takes at least four weeks, and often several months, to fabricate a silicon version of the circuit in a "chip." To reduce the design and fabrication interval, attempts have been made to provide various types of user-definable, or programmable, logic devices (PLD's).

PLD's include devices that are fusible, as well as those that are electrically-programmable and reprogrammable, such as the reprogrammable gate arrays described in my U.S. Pat. No. 4,700,187 for "Programmable, Asynchronous Logic Cell and Array. The reprogrammable devices are sometimes called "erasable, programmable logic devices," or EPLD's. Since an EPLD can be programmed more than once, an error in programming can be corrected by simply reprogramming the device. Further, the entire device can be fully, nondestructively tested at the factory. Such testing is independent of any device application and therefore need not be the user's responsibility.

In general, an EPLD comprises an array of logic elements and programmable means for interconnecting those elements. The most common earlier approaches in programmable logic devices, and a currently leading approach in EPLD's, employ variations of the programmable logic array (PLA) architecture, which is composed of an AND-array connected to an OR-array. Most PLD's add to these arrays input and output blocks containing registers, latches and feedback paths. The connections between the AND and OR arrays are programmable, as are the input and output blocks and feedback paths. Programmability of these connections is achieved through the use of fusible links, EPROM cells, EEPROM cells or static RAM cells.

Illustrative papers describing what are now referred to as EPLD's are S. N. Kukreja et al., "Combinational and Sequential Cellular Structures", *IEEE Trans. on Computers*, Vol. C-22, No. 9, p. 813 (September 1973) and F. B. Manning, "An Approach to Highly Integrated, Computer Maintained Cellular Arrays," *IEEE Trans. on Computers*, Vol. 26, No. 6, p. 536 (June 1977).

Typical commercial EPLD's include the Logic Cell Array (a trademark) from Xilinx, Inc. which is described more fully in *The Programmable Gate Array Data Book* (Xilinx, 1988). Xilinx and other companies market EPLD's and associated development systems which provide tools to aid in the design of logic systems employing their respective programmable devices.

Design entry in these products is accomplished by one of four methods: (1) schematic input of the logic circuit; (2) net list entry, by which the user enters the design by describing symbols and interconnections in words, following a standardized format; (3) state equation/diagram entry; and (4) Boolean equations. Intel's development system converts all design entry data into Boolean equations which are then converted to a sum-of-products format after logic reduction. The configurable logic block used in the Xilinx product is programmed either by the entry of Boolean equations or by the entry of a Karnaugh map.

While these EPLD architectures may represent an advance over prior logic systems which did not provide user programmability, they are far from ideal. Design entry requires the user to have extensive training in digital logic design. This, of course, limits the user base. And none of these approaches provides a tool for the modular, hierarchical design of complex circuits. Other deficiencies will be apparent to those skilled in the art.

Improvements over these EPLD's are achieved by logic arrays described in my U.S. patent application Ser. No. 06/928,527 for "Programmable Logic cell and Array." That application describes the use of programmable logic cells, and arrays of those cells, having, inter alia, the following characteristics: (1) the ability to program each cell to act either as a logic element or as one or more logical "wire" elements (i.e.) identity functions between one or more specified inputs and one or more specified outputs of the cell—these identity functions include crossovers, bends, fan-outs, and routings running both horizontally and vertically); (2) the ability to rotate programmed circuits (through 90° increments) and to reflect programmed circuits about horizontal and vertical axes; (3) an integrated logic and communication structure which emphasizes local communications; (4) a simple structure at the cell level, thereby making available a very fine-grained logic structure, and (5) suitability for implementation of both synchronous and asynchronous logic, including speed-independent circuits.

In an exemplary implementation, each cell has two inputs and two outputs, allowing the cells to be arranged in a grid such that each cell communicates one way with its north, east, south and west neighbors. The cells are programmable to assume any one of several states, to provide the foregoing characteristics.

Such arrays of cells are well-suited to implementation in an integrated circuit "chip" using modern, very-large-scale integration (VLSI). On a chip, the logical wiring capabilities of the cells make it possible to "wire around" defective cells and elements. Thus, the invention shows promise for so-called "wafer-scale" integration or fabrication. If a large wafer contains a few defective cells, those cells can simply be avoided and by-passed, with the remainder of the wafer remaining useful. This may permit the fabrication of much larger chips than has heretofore been possible, since defects normally render a chip useless.

These chips can themselves be assembled into arrays and other configurations. Such an arrangement of cells (whether disposed on one or more chips) may be referred to as a "medium." For contrast and clarity of expression, an array of chips will be referred to hereinafter as a "matrix," to distinguish it from an array of cells. A matrix of chips can be extended freely in any dimension desired. Thus, computing power can be increased by simply adding more chips to the matrix.

As indicated in the '527 Application, the basic logic cell is programmable and reprogrammable in accordance with existing technology adaptable to that purpose. Programming is accomplished by setting the states of an appropriate number of storage (i.e., memory) elements associated with each cell. In a first exemplary embodiment, the cells may be composed of NOR gates, transistor switches and gain elements for driving adjacent cells. In this way each cell may be individually programmed so that different cells on the same chip have the same or different functions as the need arises. Thus, different cells on the same chip may be operated in parallel with one another or they may be operated independently of each other.

Using a programming system such as the exemplary graphical programming environment described in the '527 application, the individual logic cells may be programmed and connected together to implement an extensive class of logic circuits. Configuration specifications for (i.e. programs for setting cell storage elements to create) circuit blocks such as adders, multiplexers, buffer stacks, and so forth, may be stored in a library for use in building more complex blocks. With an adequate library, custom hardware can be designed by simply mapping stored blocks onto selected portions of chips (i.e., the medium) and connecting the blocks together. In particular, in the mapping operation, a configuration that is stored in the library is used to specify the states of the storage elements associated with the logic cells needed to define the desired circuit. This generates a tremendous savings in the time required for the development of many types of application-specific integrated circuits (ASIC's). Moreover, this approach allows the designer to construct systems at a pictorial block-diagram level, as well as at the circuit, or detailed logic level.

Further, as described in conjunction with FIGS. 6-24 of the '527 application, blocks retrieved from the library may be moved, rotated, or reflected about a horizontal or vertical axis, to place their specification of input and output connections on different sides and positions without altering the internal electrical operation specified by the block. This capability allows the user to (1) construct systems at a pictorial block-diagram level without having to be concerned about the internal structure of each block and (2) create large blocks from smaller blocks, the larger blocks also being storable in the library for recall and for use in creating even larger blocks. Further, it enhances the designer's freedom in laying out a chip design, and reduces the size of the block-function library needed for any particular application.

SUMMARY OF THE INVENTION

I have devised further improvements in the logic cell of the '527 Application which greatly increase its versatility and usefulness with substantialy no change in the physical size of the cell. In accordance with the invention, each logic cell has four inputs, four outputs, a control store, means for multiplexing the four inputs onto two leads and logic means that operate in response to the signals on the two leads and signals from the control store to produce output signals which are applied to the four outputs. Illustrative logic functions provided by the logic means include a cross-over or identity function, changes in the direction of propagation of the two input signals, NAND and XOR gates and a D-type flip-flop. The selection of two of the four inputs as well as the selection of the particular logic function that is implemented is controlled by and therefore specified by control bits stored in the control store. Illustratively, two control bits are used to select two of the four inputs and two more control bits are used to select one of four logic functions that are available from the logic means.

The logic cells are arranged in a two-dimensional matrix such that each cell has four nearest neighbor cells, one to its left (or to the West), one to its right (or to the East), one above it (or to the North) and one below it (or to the South). Each one of the four inputs to a logic cell comes from a different one of that cell's four nearest neighbors and similarly each one of a cell's outputs is provided to a different one of that cell's four nearest neighbors.

As a result of this invention, logic cells can be fabricated having much greater functionality than was previously available in cells of approximately the same physical size. At the same time, the logic cell is relatively simple and comparatively easy to make in relatively large arrays on an integrated circuit chip. For example, prototypes of 4096 cells on a chip have been fabricated.

Accordingly, it is an object of the present invention to provide a programmable, universal digital logic device which can be programmed easily to implement a large class of digital circuits.

Another object is to provide such a device which is electrically reprogrammable.

Yet another object of the invention is to provide a programmable logic device, which supports the translation, rotation and reflection of logic circuits and circuit blocks as part of the process of designing a system with one or more of such devices.

BRIEF DESCRIPTION OF THE DRAWING

These and other objects, features and advantages of the invention may be better understood by referring to the following detailed description, which should be read in conjunction with the accompanying drawing in which.

DETAILED DESCRIPTION OF DRAWING

Figure 1:
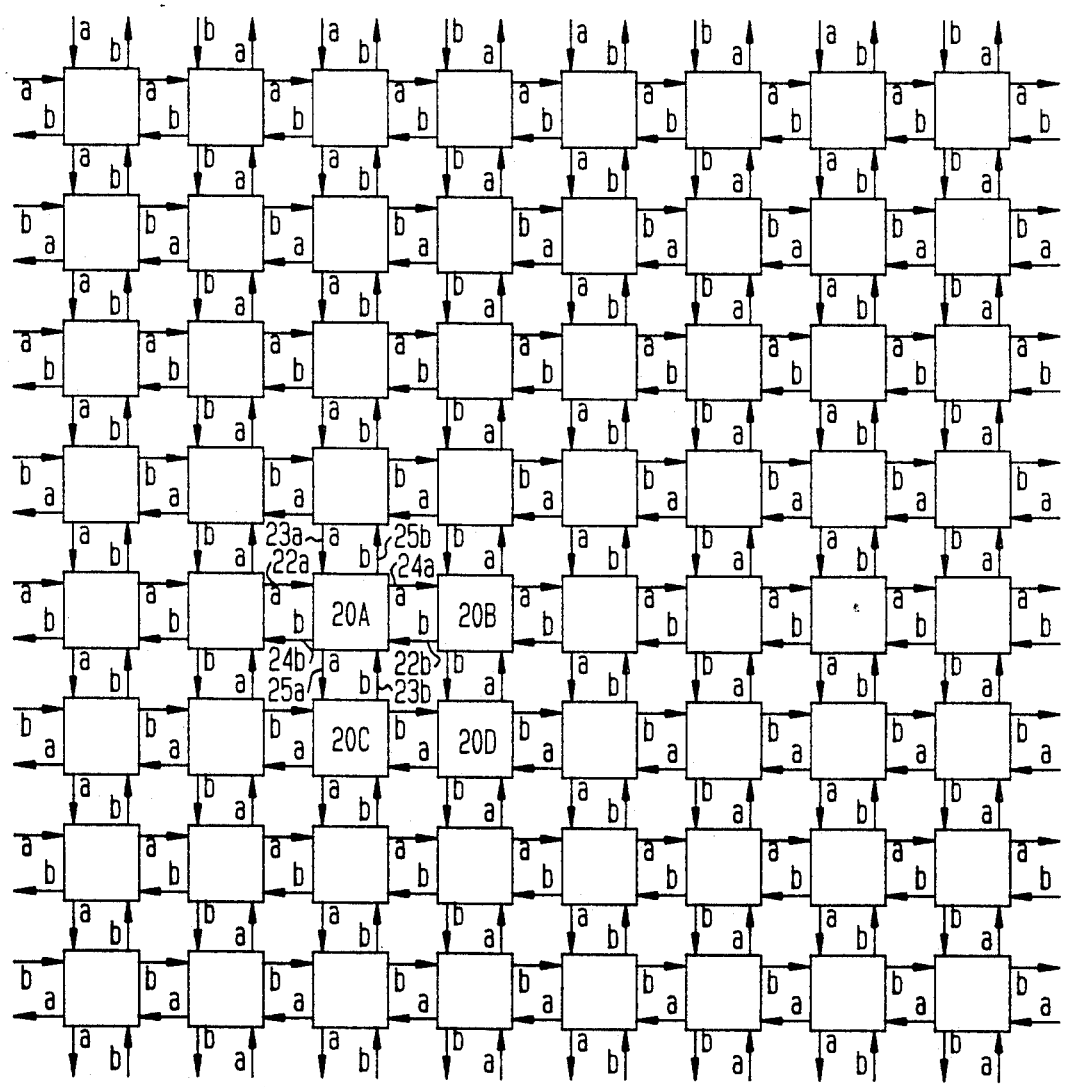
FIG. 1 is a diagrammatic illustration of an exemplary portion of an array of cells according to the present invention.
Figure 2A:
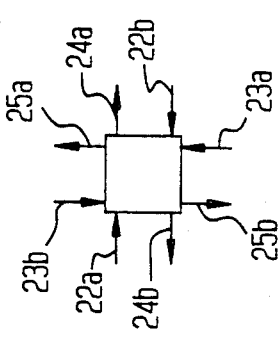
FIGS. 2A-2D are diagrammatic illustrations of the four possible orientations of the cells shown in FIG. 1.
Figure 2B:
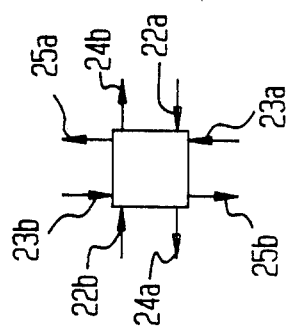
Figure 2C:
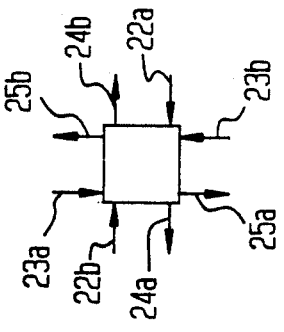
Figure 2D:
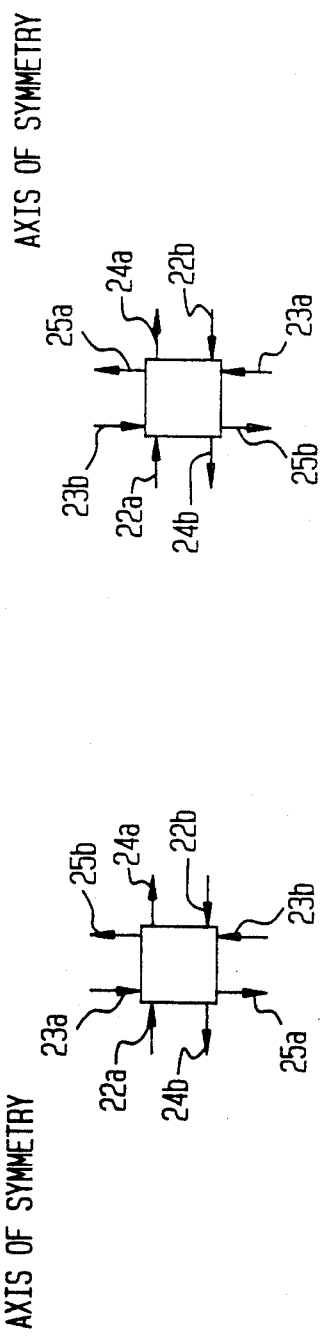

FIG. 1 depicts an array 10 of cells 20 formed in accordance with the present invention. As is apparent, the cells are arranged in a two dimensional matrix with each cell having four nearest neighbors, one to its left (or to the West) one to its right (or to the East), one above it (or to the North) and one below it (or to the South). Each one of cells 20 has four inputs 22a, 23a, 22b, 23b and four outputs 24a, 25a, 24b, 25b. Each of the four inputs of a cell is connected to one of the outputs of a different one of that cell's four nearest neighbor cells; and each of the four outputs of a cell is connected to an input of a different one of that cell's four nearest neighbor cells. In addition to the inputs shown in FIG. 1 each cell also has a global-clock input and control-signal inputs.

Close examination of FIG. 1 will reveal that there are differences among the cells relating to the orientation of their inputs and outputs. For example, in some cells, both inputs 22a, 23a are located in the upper left corner, in others in the bottom right corner. In still other cells, one input is to one corner while the other is to the diametrically opposite corner. In all, there are four different orientations of the inputs and outputs which are depicted in cells 20A, 20B, 20C, 20D of FIGS. 1 and 2A-2D. As will be apparent, each of cells 20A, 20B, 20C, 20D is symmetric about a northeast-southwest or a northwest-southeast axis of symmetry. This use of four different cell orientations is to be contrasted with prior art cells such as those described by Manning in which each cell in an array is identical and has the same orientation in the array. In such prior art cells, the effect of different orientations of the cells can only be achieved at the expense of increased state storage, increased decoding logic, increased switching logic, increased processing logic and increased wiring, all of which result in cells having larger physical size and slower switching speed.

Figure 3:
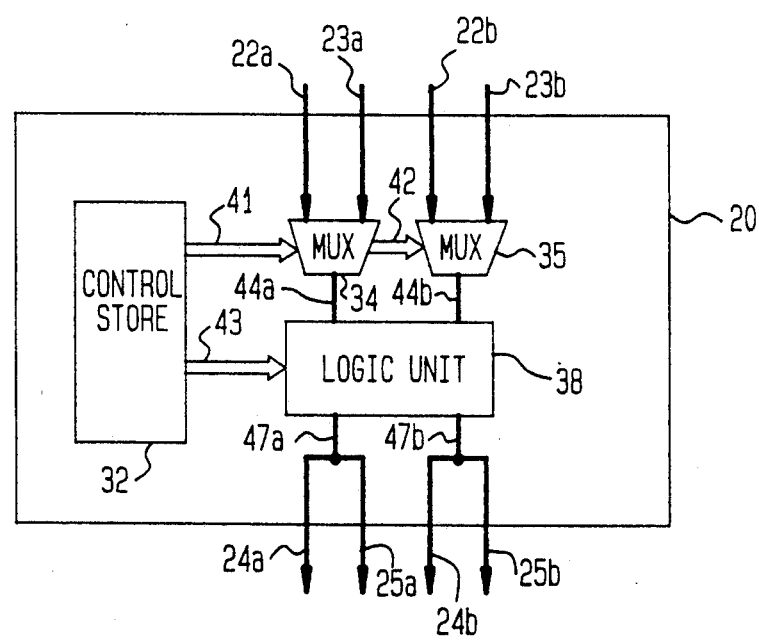
FIG. 3 is a block diagram depicting the internal structure of a cell of FIG. 1.

In an illustrative embodiment of cell 20 as shown in FIG. 3, the cell comprises a control store 32, two two-to-one multiplexers 34, 35 and a logic unit 38. Logic unit 38 can implement any one of a plurality of logic functions. Control store 32 illustratively comprises a plurality of storage elements, each of which stores a control bit. These control bits are used to specify which inputs are selected by the multiplexers and which logic function is implemented by the logic unit. The control bits are loaded into the store under program control via appropriate signal leads (not shown) and may be modified simply by reloading the store.

Two inputs 22a, 23a are applied to multiplexer 34 and the other two inputs 22b, 23b are applied to multiplexer 35. Multiplexer 34 connects one of its two inputs to a lead 44a to logic unit 38 in accordance with a control bit supplied by control store 32 via signal lead 41. Similarly, multiplexer 35 connects one of its two inputs to a lead 44b to logic unit 38 in accordance with a control bit supplied by control store 32 via signal lead 42. As a result, there are four possible combinations of inputs (i.e. (22a, 22b), (22a, 23b), (23a, 22b), (23a, 23b)) that can be applied to logic unit 38 via leads 44a, 44b.

In response to the signals on leads 41, 42 and the control signals on lead 43 from control store 32, logic unit 38 generates output signals on leads 47a, 47b. The signal on lead 47a is applied to outputs 24a, 25a and the signal on lead 47b is applied to the outputs 24b, 25b.

The inputs and outputs are connected so that the two inputs to a multiplexer are signals that are propagating at right angles to each other in the array and the two outputs derived from one output lead likewise propagate signals at right angles to each other. This relationship is specified by the use of the legends a and b in the drawings. Referring, for example, to cell 20A in FIG. 1, it is seen that its two inputs 22a, 23a, come from cells to the West and to the North of cell 20A. Thus, the signals on these inputs are propagating in directions that are at right angles to each other. Likewise, the signals on the two inputs 22b, 23b to cell 20A are propagating at right angles to each other. The two outputs 24a, 25a from cell 20A are supplied to cells to the South and East, again propagating at right angles to each other; and the two outputs 24b, 25b from cell 20A are supplied to cells to the North and West.

Figure 4A:
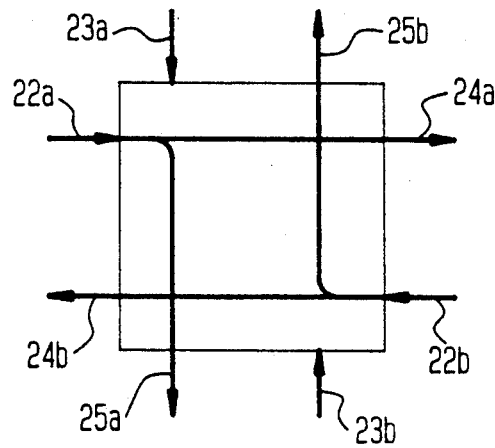
FIGS. 4A-4P are diagrammatic illustrations of a possible set of states of a cell of FIG. 1.

The logic unit of each cell 20 can be programmed to assume (at any appropriate time) one of a number of different states, each providing an associated function. (Hereinafter, the term "state" is sometimes used to refer to the function, not just the state assignment.) FIGS. 4A-4P show an illustrative set of sixteen states in which a cell 20 may be placed. These states provide four different output functions for each of the four possible combinations of inputs. Additional or different states may be provided.

Figure 4B:
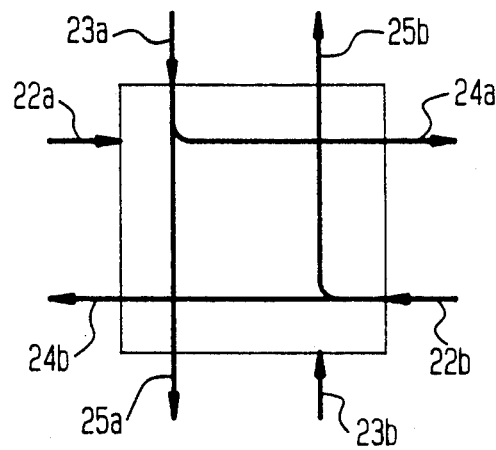
Figure 4C:
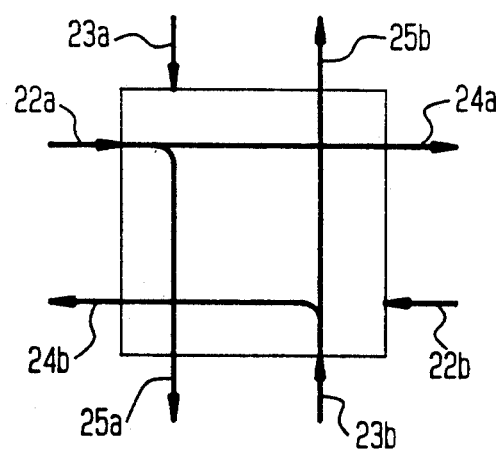
Figure 4D:
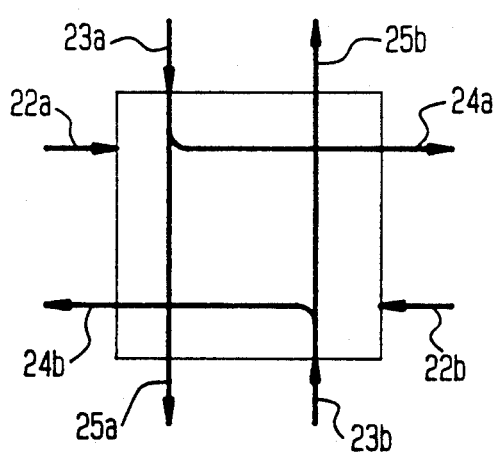
Figure 4E:
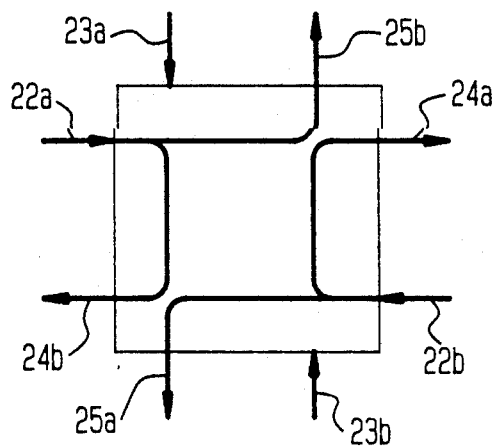

More particularly, FIGS. 4A-4D illustrate the implementation of four identity operations. In FIG. 4A input lead 22a is logically connected to output leads 24a, 25a without any logical transformation and input lead 22b is logically connected to output leads 24b, 25b without any logical transformation. Thus, there is no coupling between those two connection-pairs. FIGS. 4B-4D illustrate the same identity operations for the other three combinations of inputs.

Figure 4F:
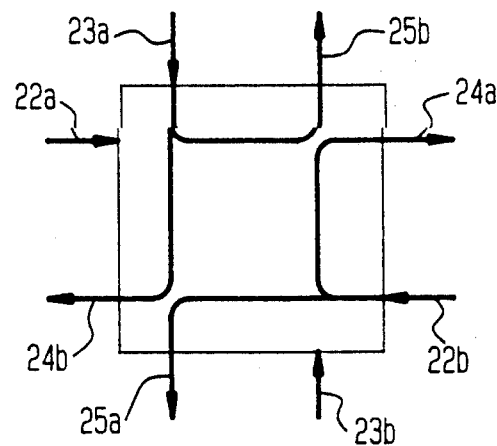
Figure 4G:
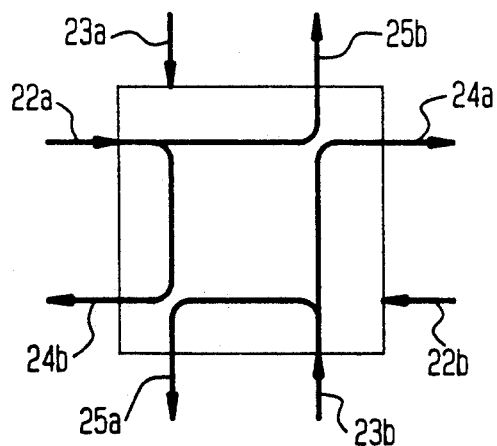
Figure 4H:
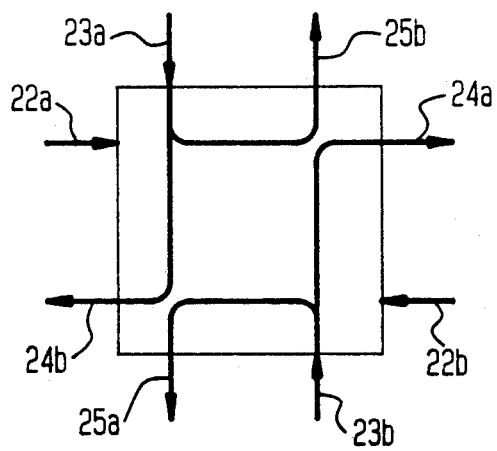
Figure 4I:
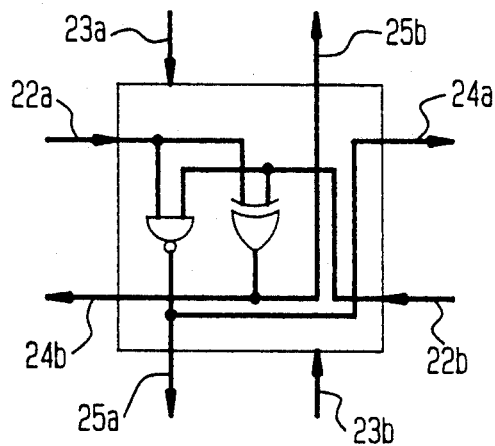
Figure 4J:
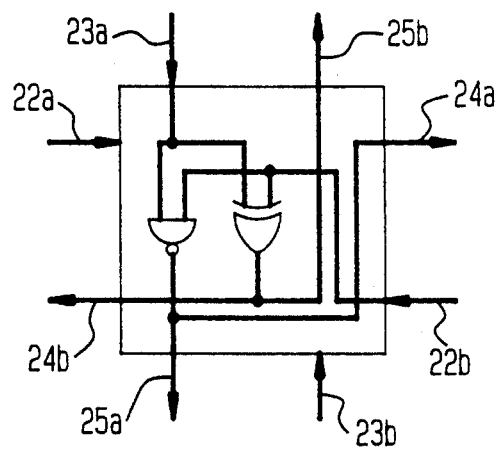
Figure 4K:
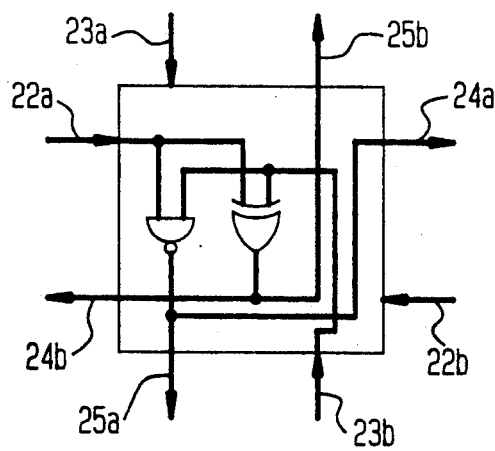
Figure 4L:
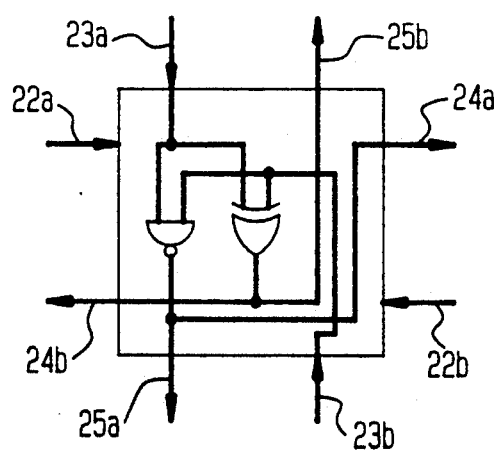
Figure 4M:
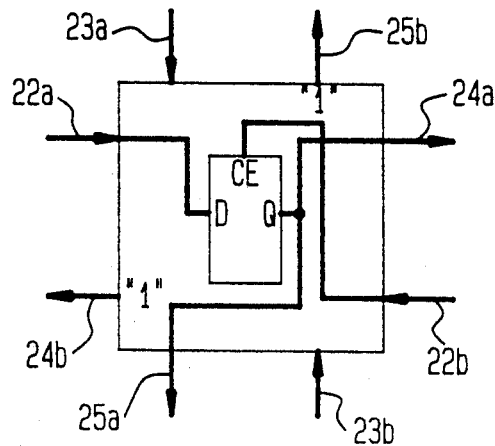
Figure 4N:
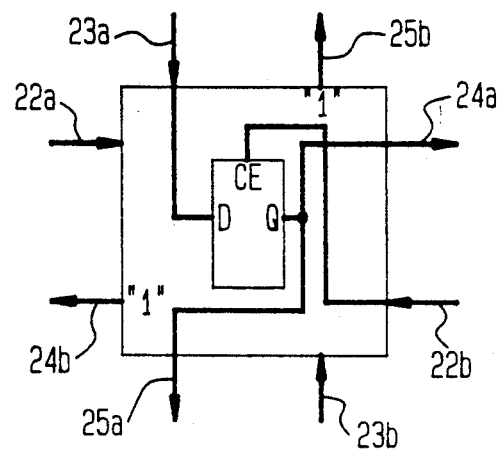
Figure 4O:
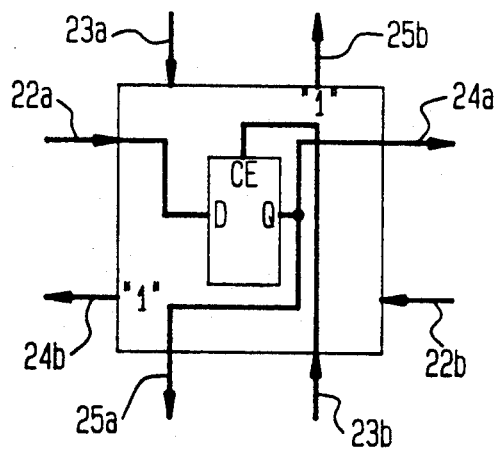
Figure 4P:
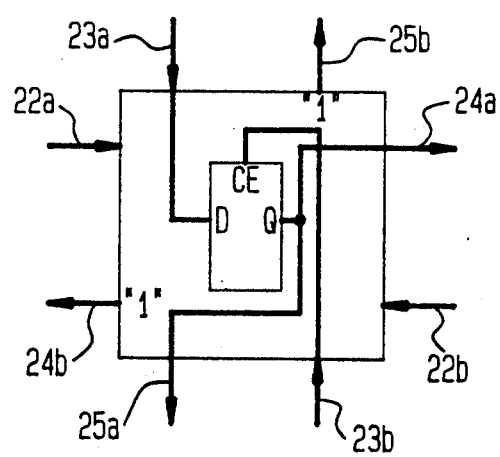

FIGS. 4E-4H depict interconnections between the a and b leads. For example, in FIG. 4E input lead 22a directly feeds output leads 24b, 25b without logical transformation and input lead 22b directly feeds output leads 24a, 25a without logical transformation. Again, there is no coupling between those two connection-pairs. FIGS. 4F-4H ilustrate the same interconnection operations for the other three combinations of inputs.

FIGS. 4I-4L implement two-input Boolean logic elements. Illustratively, the logical exclusive OR of the signals on two input leads is provided on output leads 24b, 25b; and the logical NAND of the signals on the input leads is provided on output leads 24a, 25a. FIGS. 4I-4L illustrate the four possible combinations of the two pairs of inputs (22a, 23a) and (22b, 23b) to these logic elements.

Finally, FIGS. 4M-4P schematically illustrate the implementation of a D-type flip-flop. In this case, the signal on one of input leads 22b, 23b is applied to the CE terminal of the flip-flop to control whether the flip-flop maintains its previous state or reads in data supplied via one of input leads 22a, 23a. The global clock signal (not shown) is used in conventional fashion to synchronize changes in the state of the flip flop. The output of the flip-flop is made available on output leads 24a, 25a. A constant logic level, specifically a logical level of "1" (or high signal), is made available on output leads 24b, 25b. Again, the four possible combinations of the two pairs of inputs are depicted in FIGS. 4M-4P.

Figure 5:
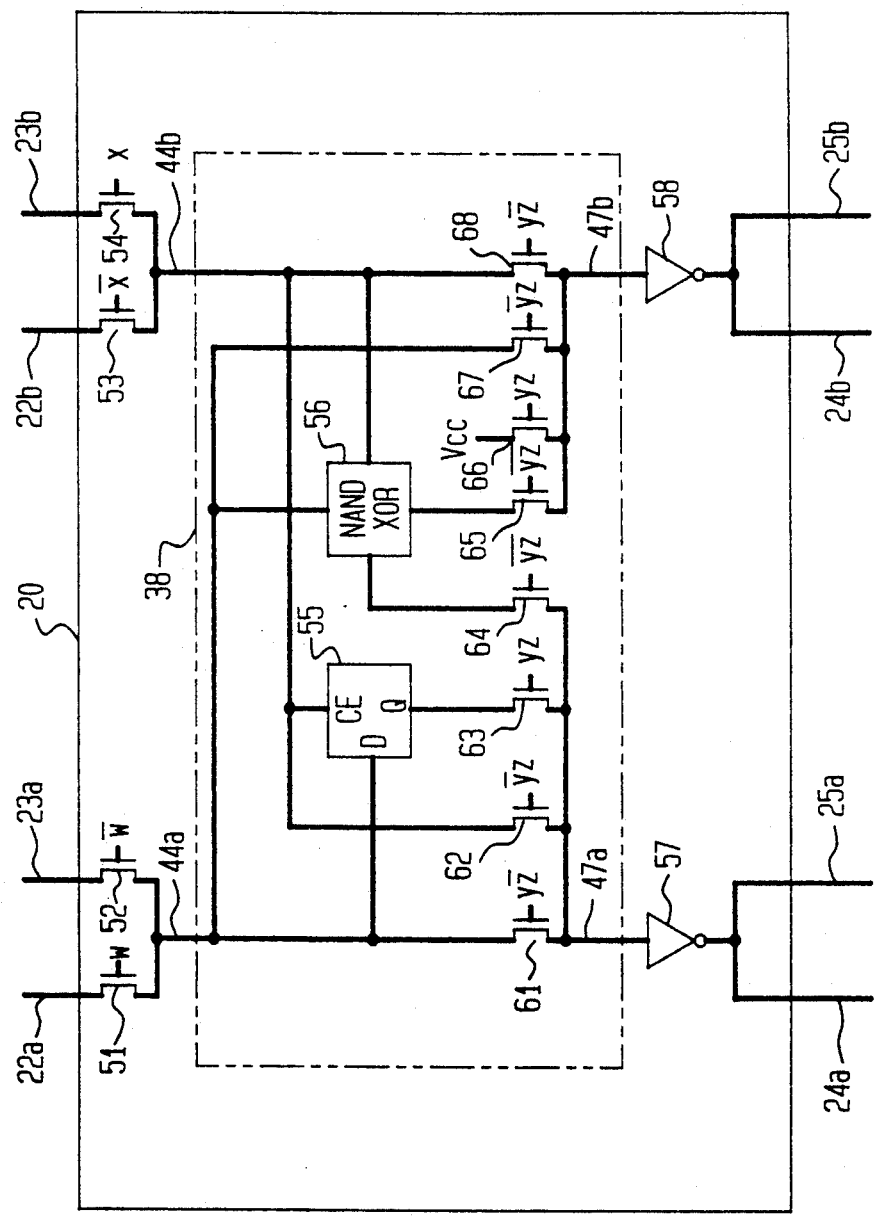
FIGS. 5-8 are schematic diagrams of four illustrative circuits for implementing a cell having the structure depicted in FIGS. 3 and 4A-4P.

A schematic circuit for implementing the sixteen-state cell 20 of FIGS. 4A-4P is shown in FIG. 5. The circuit comprises four input gates 51-54, a D-type flip-flop 55, a NAND/XOR logic circuit 56, inverting drivers 57, 58, and control gates 61-68. Numerous alternatives are available for implementing these components in an integrated circuit.

Various combinations of control bits w,x,y,z and their inverses are applied to gates 51-54 and 61-68 from control store 32 (shown in FIG. 2). The gates are turned on (i.e. they conduct) when the applied control signal is high (i.e., a logical "1"). Gates 51 and 52 function as multiplexer 34 and gates 53, 54 function as multiplexer 35. One of the two inputs 22a, 23a is selected by a control bit w (or its inverse, $\bar{w}$) which is applied to gates 51, 52 and one of the two inputs 22b, 23b is selected by a control bit x (or its inverse, $\bar{x}$) which is applied to gates 53, 54. Combinations of the control bits y and z and their inverses select one of four logic functions to be implemented by logic unit 38. In particular, if the signal $y\bar{z}$ is high, gates 61 and 68 are on and the identity function is implemented. Thus, the signal on the selected input 22a or 23a is supplied to output lead 47a and therefore to outputs 24a, 25a and the signal on the selected input 22b or 23b is supplied to output lead 47b and therefore to outputs 24b, 25b. Conversely, if the signal $\bar{y}z$ is high, gates 62 and 67 are turned on and the signals on the outputs are interchanged. If the signal yz is high, gates 63 and 66 are on and the output of flip-flop 55 is supplied to output lead 47a and a high signal $V_{cc}$ is supplied to output lead 47b. Finally, if $\overline{yz}$ is high, gates 64 and 65 are on and the NAND of the input signals on input leads 44a and 44b is supplied to output lead 47a and the XOR of these signals is supplied to output lead 47b. Illustratively, the control signals $y\bar{z}$, $\bar{y}z$, yz and $\overline{yz}$ are generated by combinatorial logic (not shown) connected to the outputs of the flip-flops that store the control bits.

Figure 6:
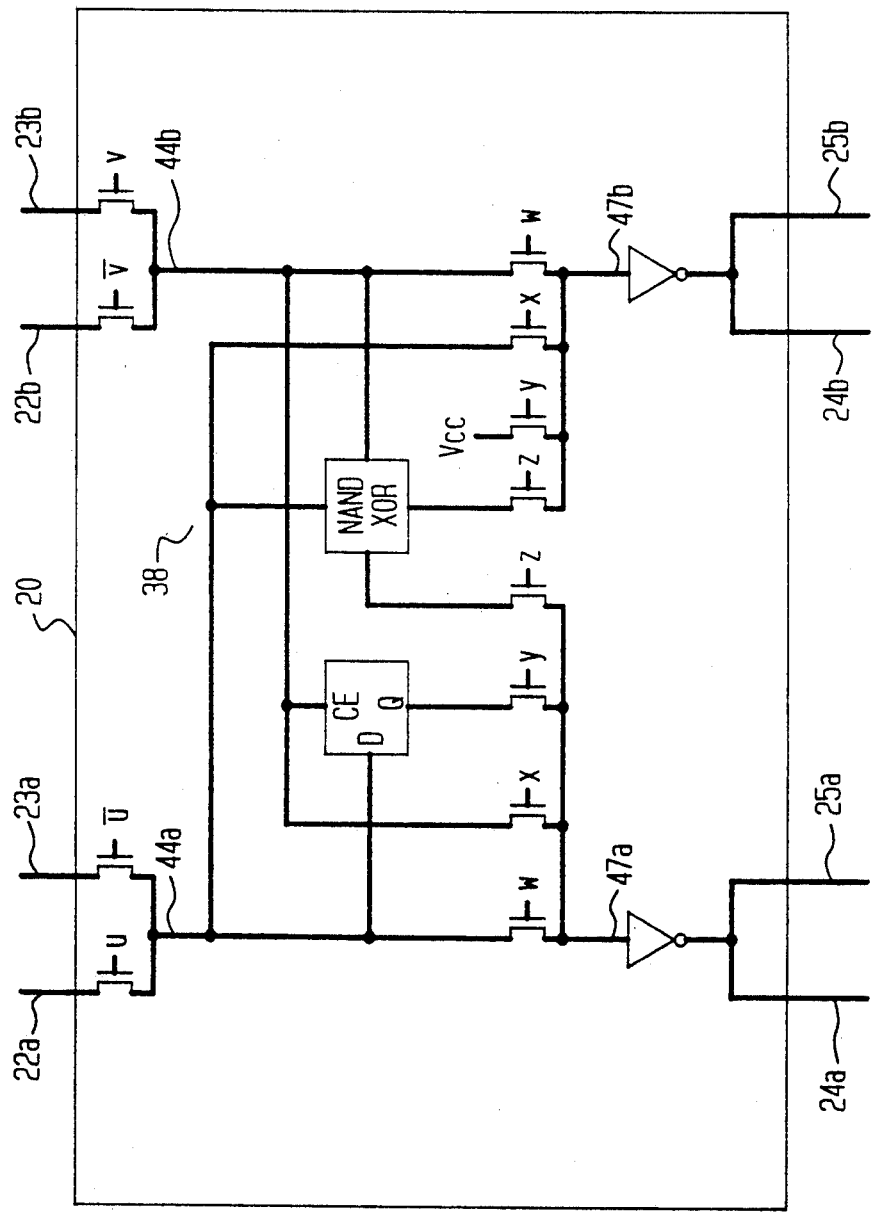
Figure 7:
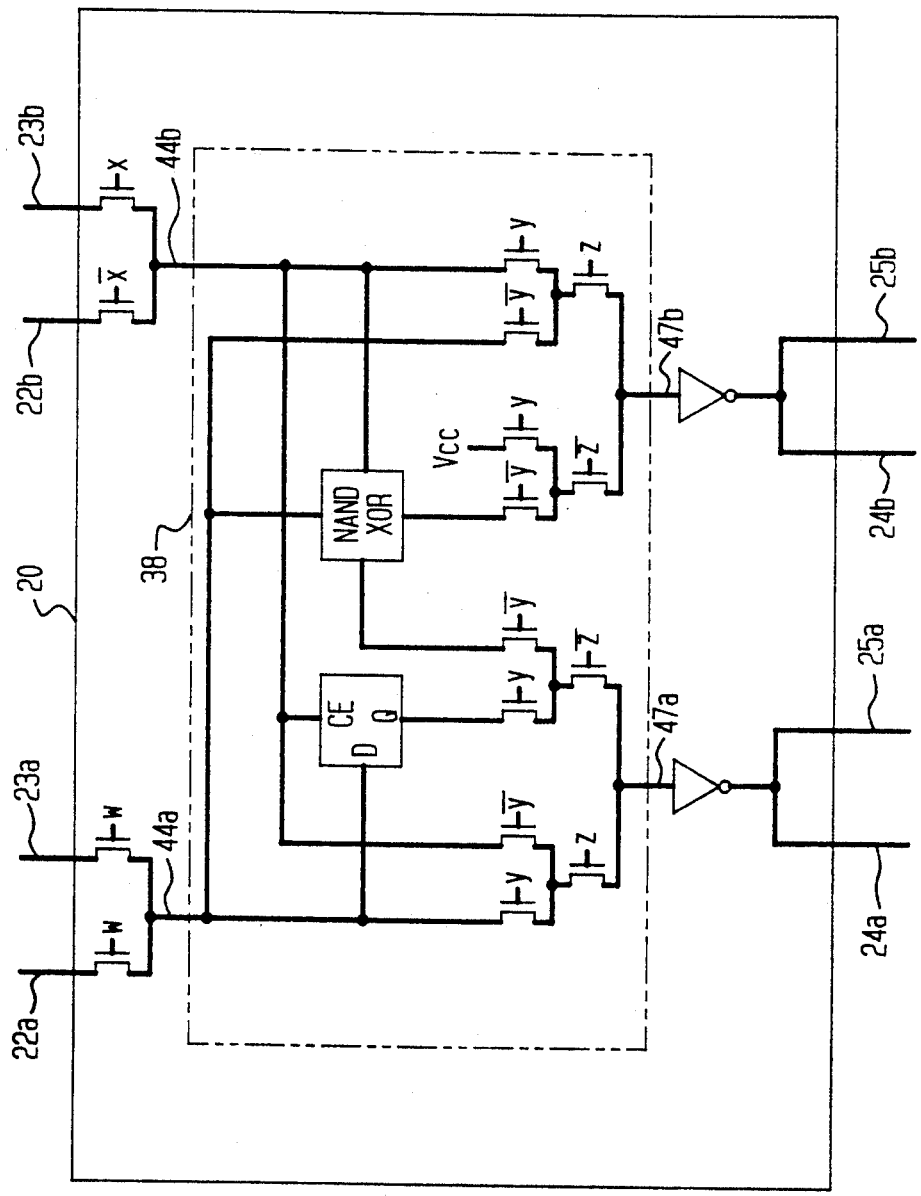
Figure 8:
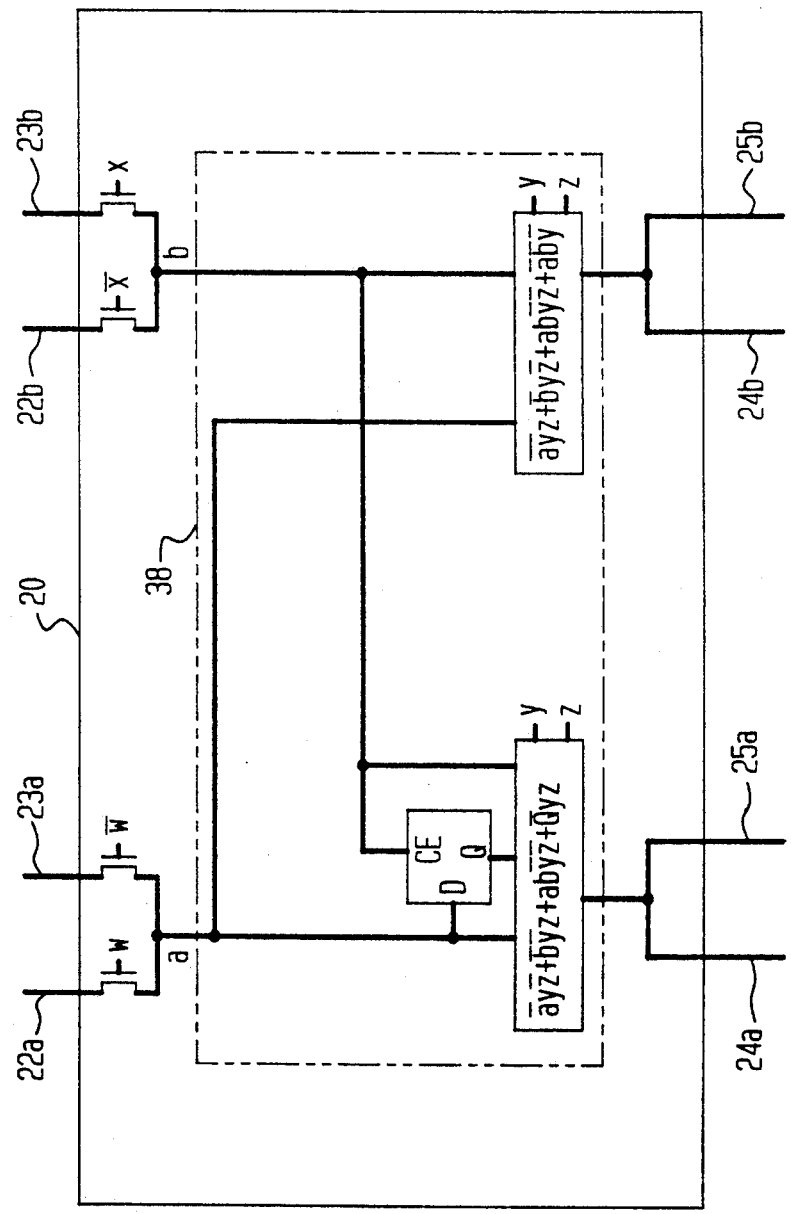

FIGS. 6 through 8 provide alternative implementations of the logic cell depicted in FIG. 5. They differ in the number of control bits that are used and how the control bits are combined. For example, FIG. 6 implements the logic cell using six control bits and only two inverses but otherwise is the same as that of FIG. 5. FIG. 7 combines the y and z control bits using separate gates in logic unit 38 rather than combinatorial logic in the control store. FIG. 8 uses only four control bits and two inverses and implements the entire logic unit except for the flip-flop using two units 71, 72 of combinatorial logic.

In addition to or as a replacement for the sixteen states of FIGS. 4A-4P that are implemented in the circuits of FIGS. 5-8, numerous other functions may be implemented in suitable circuits. For example, a set of eight functions is depicted in FIGS. 12A-12H of the '527 application and the implementation of that set of functions is shown in FIG. 13 of that application. From the foregoing description of the present invention, it is believed that one skilled in the art will readily be able to implement such a set of eight functions in the logic cell of the present invention.

As in the case of the logic cells of the '527 application, the logic cells of the present invention may be combined to implement more complicated functions such as incrementers, decrementers, shift registers, adders, multipliers and comparators. Indeed, there is no reason why any device that is a combination of the basic functions available in the logic cell cannot be realized in an array of logic cells of the present invention.

From the foregoing description of my invention, numerous alterations, modifications and improvements will be readily apparent. For example, the logic cells may incorporate other functions and different circuits may implement these functions. Other connection patterns may be used to interconnect the individual logic cells. For example, the four inputs to each cell may be applied in parallel to two four-to-one multiplexers and one of these inputs could be selected at each multiplexer by appropriate control bits from the control store. Other arrangements could also be used to control operation of the logic cell. For example, where reprogrammability is not a consideration, the control store could also be implemented as a one-time programmable device in which fusible links were blown to select the particular operating state desired for a given logic cell. Such obvious alterations, modifications and improvements, even if not expressly described herein, are intended to be suggested by this disclosure and within the spirit and scope of the invention.

What is claimed is:

1. A two-dimensional array of logic cells, each cell except those at the edges of the array having four nearest neighbors, one to the left (or West), one to the right (or East), one above (or to the North) and one below (or to the South), each cell comprising:

four inputs, one from each of its four nearest neighbors, four outputs, one to each of its four nearest neighbors, control means, means for multiplexing the four inputs onto first and second input leads, the inputs connected to said input leads being specified by signals from said control means, and logic means for generating signals on said outputs in response to signals on said input leads and signals from said control means, said logic means comprising at least means for passing signals on said input leads to said outputs without logical transformation and means for implementing at least one logical transformation on the signals on said input leads.

2. The apparatus of claim 1 wherein said control means provides signals to said multiplexing means and said logic means, whereby said signals specify the logical transformation implemented by a given cell.

3. The apparatus of claim 2 wherein said control means comprises a one-time programmable device, whereby a given logic cell can be permanently programmed to implement a specified logical transformation.

4. The apparatus of claim 1 wherein the inputs and outputs of each cell are symmetrical about one of a northwest-southeast axis and a northeast-southwest axis.

5. The apparatus of claim 1 wherein the logic means implements a pair of Boolean logic functions.

6. The apparatus of claim 5, wherein the logic means implements an exclusive OR and a NAND function.

7. The apparatus of claim 1 wherein the logic means implement a flip-flop.

8. The apparatus of claim 1 wherein the logic means provides a constant logic signal to at least one of the outputs.

9. The apparatus of claim 1 wherein the multiplexing means comprises first and second multiplexers each of which has two inputs, one of the two inputs to one multiplexer coming from an adjacent cell that is a nearest neighbor either to the left or to the right and a second of the two inputs coming from an adjacent cell that is a nearest neighbor either above or below.

10. The apparatus of claim 9 wherein the logic means causes an input that enters a cell from the left or from the right to leave the cell destined to the cell above or below and causes an input that enters a cell from above or below to leave the cell destined to the cell to the left or right.

11. The apparatus of claim 1 wherein the logic means has two output leads, one of which fans out to two of said outputs and the other of which fans out to the other two of said outputs.

12. A computational medium comprising a two-dimensional array of logic cells, each logic cell except those at an edge of the array comprising:
four inputs, a first input coming from a preceding cell in a first dimension of the array, a second input coming from a succeeding cell in the first dimension of the array, a third input coming from a preceding cell in a second dimension of the array and a fourth input coming from a succeeding cell in the second dimension of the array,
four outputs, a first output going to a preceding cell in a first dimension of the array, a second output going to a succeeding cell in the first dimension of the array, a third output going to a preceding cell in a second dimension of the array and a fourth output going to a succeeding cell in the second dimension of the array,
control means,
means for multiplexing the first, second, third and fourth inputs onto first and second input leads, the inputs connected to said input leads being specified by signals from said control means, and
logic means for generating signals on said outputs in response to signals on said input leads and signals from said control means, said logic means comprising at least means for passing signals on said input leads to said outputs without logical transformation and means for implementing at least one logical transformation on the signals on said input leads.

13. A digital logic cell for use in a programmable device, such cell comprising:
four inputs,
four outputs,
control means,
means for multiplexing the four inputs onto first and second input leads, the inputs connected to said input leads being specified by signals from said control means, and
logic means for generating signals on said outputs in response to signals on said input leads and signals from said control means, said logic means comprising at least means for passing signals on said input leads to said outputs without logical transformation and means for implementing at least one logical transformation on the signals on said input leads.

14. The apparatus of claim 13 wherein said control means provides signals to said multiplexing means and said logic means, whereby said signals specify the logical transformation implemented by a given cell.

15. The apparatus of claim 14 wherein said control means comprises a one-time programmable device, whereby a given logic cell can be permanently programmed to implement a specified logical transformation.

16. The apparatus of claim 13 wherein the cell is rectangular and the inputs and outputs of the cell are symmetrical about one of a northwest-southeast axis running between two opposite corners of the cell and a northeast-southwest axis running between the other two opposite corners of the cell.

17. The apparatus of claim 13 wherein the logic means implements a pair of Boolean logic functions.

18. The apparatus of claim 13 wherein the logic means implements an exclusive OR and a NAND function.

19. The apparatus of claim 13 wherein the logic means implements a flip-flop.

20. The apparatus of claim 13 wherein the logic means provides a constant logic high signal to at least one of the outputs.

21. The apparatus of claim 13 wherein the multiplexing means comprises first and second multiplexers each of which has two inputs, one of the two inputs to one multiplexer coming from an adjacent cell that is a nearest neighbor either to the left or to the right and a second of the two inputs coming from an adjacent cell that is a nearest neighbor either above or below.

22. The apparatus of claim 20 wherein the logic means causes an input that enters a cell from the left or from the right to leave the cell destined to the cell above or below and causes an input that enters a cell from above or below to leave the cell destined to the cell to the left or right.

23. The apparatus of claim 13 wherein the logic means has two output leads, one of which fans out to two of said outputs and the other of which fans out to the other two of said outputs.

* * * * *